United States Patent
Errico et al.

(10) Patent No.: US 12,306,242 B2
(45) Date of Patent: May 20, 2025

(54) SELF-TESTING CIRCUITS FOR DEVICES HAVING MULTIPLE INPUT CHANNELS WITH REDUNDANCY

(71) Applicant: STMicroelectronics S.r.l., Agrate Brianza (IT)

(72) Inventors: Nicola Errico, Rho (IT); Alessandro Cannone, Rho (IT); Enrico Ferrara, Milan (IT); Luigi Piscitelli, Cusano Milanino (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 346 days.

(21) Appl. No.: 17/987,379

(22) Filed: Nov. 15, 2022

(65) Prior Publication Data

US 2024/0159819 A1   May 16, 2024

(51) Int. Cl.
  *G01R 31/28*    (2006.01)
  *G01R 31/3167*  (2006.01)
  *G01R 31/319*   (2006.01)

(52) U.S. Cl.
  CPC ..... *G01R 31/2834* (2013.01); *G01R 31/3167* (2013.01); *G01R 31/31926* (2013.01)

(58) Field of Classification Search
  CPC ............ G01R 31/2834; G01R 31/3167; G01R 31/31926
  USPC ....... 324/500, 600, 617–622, 650, 521, 683, 324/76.11, 76.52, 76.53, 76.77, 757.05, 324/762.01, 762.06
  See application file for complete search history.

(56) References Cited

U.S. PATENT DOCUMENTS

| | | | | |
|---|---|---|---|---|
| 5,861,774 A | * | 1/1999 | Blumenthal | H03G 3/30 324/762.02 |
| 2012/0206282 A1 | | 8/2012 | Gorbold | |
| 2018/0247522 A1 | | 8/2018 | Motz et al. | |
| 2021/0199719 A1 | * | 7/2021 | Shin | G01R 31/3004 |
| 2024/0097686 A1 | * | 3/2024 | Mai | H03K 17/693 |

FOREIGN PATENT DOCUMENTS

| | | |
|---|---|---|
| DE | 102017103873 B4 | 10/2020 |
| EP | 3996281 A1 | 5/2022 |

* cited by examiner

*Primary Examiner* — Raul J Rios Russo
*Assistant Examiner* — Trung Q Nguyen
(74) *Attorney, Agent, or Firm* — Slater Matsil, LLP

(57) ABSTRACT

A circuit includes: first analog-to-digital converters (ADCs) configured to be coupled to respective ones of first sensors; a first multiplexer (MUX) coupled to output terminals of the first ADCs; a second MUX configured to be coupled to second sensors which are redundant sensors for the first sensors; a second ADC coupled to an output terminal of the second MUX, the first MUX and the second MUX being controlled by a selection signal; a first checker circuit configured to compare a first data at an output terminal of the first MUX with a second data at an output terminal of the second ADC; and a plurality of switches coupled between respective ones of the input terminals of the second MUX and a reference voltage node.

20 Claims, 5 Drawing Sheets

SELF-TESTING CIRCUITS FOR DEVICES HAVING MULTIPLE INPUT CHANNELS WITH REDUNDANCY

TECHNICAL FIELD

The present invention relates generally to self-testing circuits for devices or systems having multiple input channels with redundant sensors in the input channels.

BACKGROUND

Due to the stringent safety requirements for automotive applications, redundancy is used for many critical devices or systems. For example, in the transmission control unit of an automobile, the key blocks are the valve drivers used to drive solenoid loads, which are the typical loads of automatic transmission systems. The precision of electrical currents in the valve drivers of the transmission control unit is heavily influenced by temperature. The transmission control unit may be implemented as an integrated circuit (IC) device having multiple input channels and multiple output channels, with a thermal sensor in each of the input channels, and with valve drivers (e.g., a high-side driver and a low-side driver) in each of the output channels for driving a load. Outputs of the thermal sensor in each input channel are used by a calibration algorithm (e.g., interpolation algorithm) in order to remove current errors for different levels of electrical current. Since the thermal sensors should be protected from single point faults due to the safety requirements of automotive applications, a redundant thermal sensor is used in each of the input channels.

The transmission control unit is usually formed as an IC device to achieve high integration density, lower power consumption, and lower cost. IC devices are tested in the manufacturing facilities, e.g., using automatic test equipment (ATE) before being shipped to customers. Throughout the life span of the IC devices, periodic functional testing may be performed to ensure that the devices are functioning properly. For IC devices having multiple input channels with redundancy (e.g., multiple input channels with a primary sensor and a redundant sensor in each input channel), testing all the sensors in all the input channels may be time consuming. In addition, besides testing the sensors, it may be advantageous to test other components of the IC device, such as the multiplexer used in the IC for selecting different input channels. There is a need in the art for circuits that perform efficient self-testing of ICs having multiple input channels.

SUMMARY

In some embodiments, a circuit includes: a first plurality of analog-to-digital converters (ADCs) configured to be coupled to respective ones of a first plurality of sensors; a first multiplexer (MUX), wherein input terminals of the first MUX are coupled to respective output terminals of the first plurality of ADCs; a second MUX, wherein input terminals of the second MUX are configured to be coupled to respective ones of a second plurality of sensors, wherein each of the second plurality of sensors is a redundant sensor for a respective one of the first plurality of sensors; a second ADC coupled to an output terminal of the second MUX, wherein the first MUX and the second MUX are controlled by a selection signal; a first checker circuit, wherein a first input terminal of the first checker circuit is coupled to an output terminal of the first MUX, and a second input terminal of the first checker circuit is coupled to an output terminal of the second ADC, wherein the first checker circuit is configured to compare a first data at the first input terminal of the first checker circuit with a second data at the second input terminal of the first checker circuit; and a third plurality of switches coupled between respective ones of the input terminals of the second MUX and a reference voltage node.

In some embodiments, an integrated circuit (IC) device having a plurality of input channels includes: a first multiplexer (MUX) configured to receive first outputs from a first plurality of analog-to-digital converters (ADCs) coupled to a plurality of primary sensors; a second MUX configured to receive second outputs from a plurality of redundant sensors, wherein each redundant sensor of the plurality of redundant sensors and a respective primary sensor of the plurality of primary sensors are disposed in a same input channel of the plurality of input channels and are configured to sense a same physical phenomenon; a second ADC coupled to an output terminal of the second MUX; a first checker circuit configured to compare a first output of the first MUX and a second output of the second ADC, wherein during a self-testing process of the IC device, the first MUX and the second MUX are configured to be synchronized such that the first output of the first MUX and the second output of the second ADC are digital samples from the same input channel; and a plurality of switches, wherein each switch of the plurality of switches is coupled between a respective input terminal of the second MUX and a reference voltage node.

In some embodiments, a method of testing a device having a plurality of input channels includes: converting first outputs of primary sensors in the plurality of input channels into a first plurality of digital samples using a first plurality of analog-to-digital converters (ADCs), wherein each of the plurality of input channels has a primary sensor and a redundant sensor; injecting a fault condition at the redundant sensor in a first one of the plurality of input channels, wherein second outputs of the redundant sensors in the plurality of input channels are coupled to input terminals of a multiplexer (MUX); and after injecting the fault condition, converting the second outputs of the redundant sensors in the plurality of input channels into a second plurality of digital samples, which includes: sequentially selecting each of the second outputs of the redundant sensors as an output of the MUX; and converting each of the sequentially selected output of the MUX into a respective digital sample using a second ADC, wherein the digital samples of the sequentially selected outputs of the MUX form the second plurality of digital samples. The method further includes comparing, using a first checker circuit, each of the first plurality of digital samples with a respective one of the second plurality of digital samples from a same input channel.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference numerals (e.g., 101) or labels (e.g., "Sensor_0") generally designate the same component parts throughout the various views, which will generally not be re-described in the interest of brevity. For a more complete understanding of the invention, reference is now made to the following descriptions taken in conjunction with the accompanying drawings, in which:

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely self-testing circuits for system having a plurality of input channels with redundancy.

Figure 1:
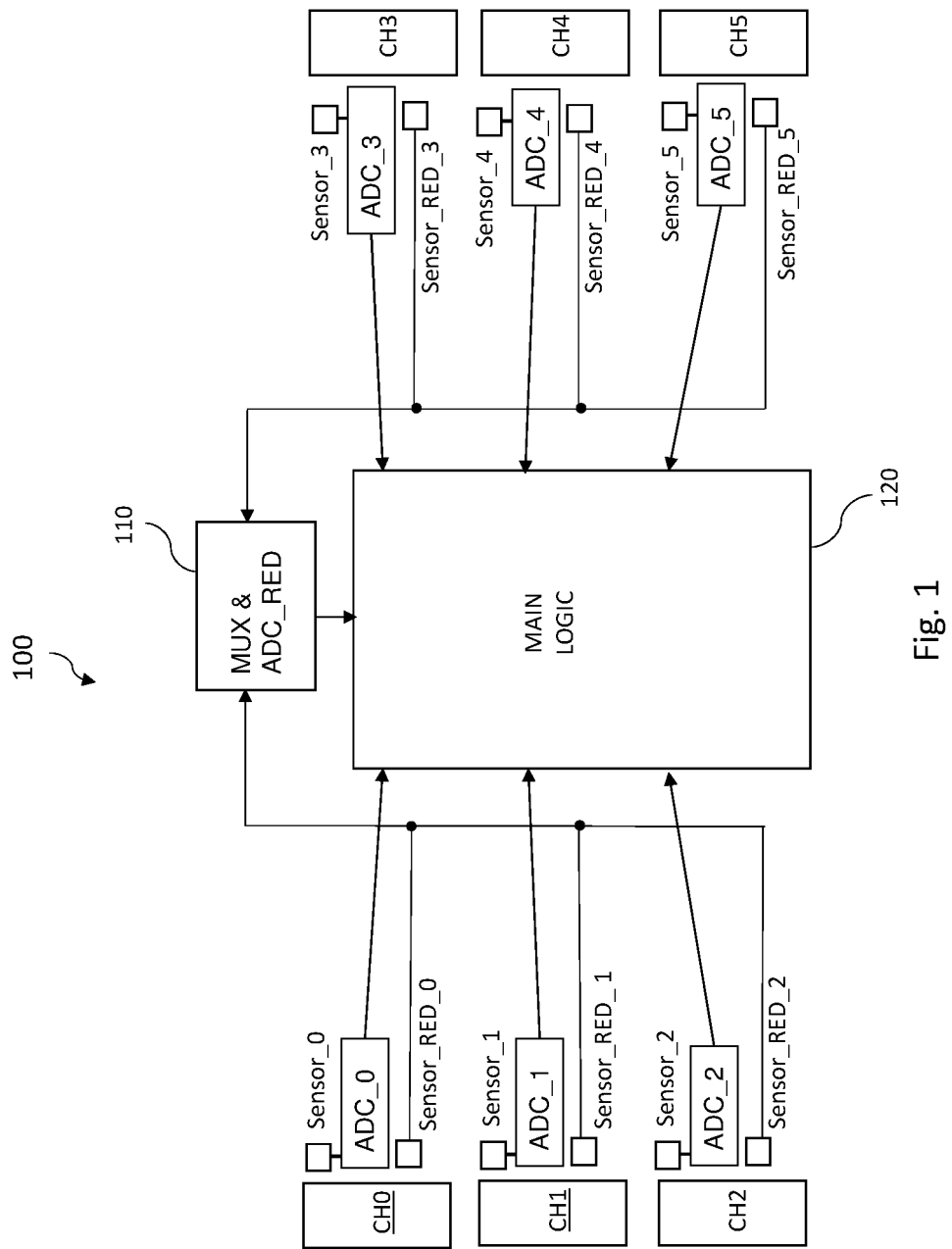
FIG. 1 illustrates a block diagram of a system having a plurality of input channels with redundancy, in an embodiment.

FIG. 1 illustrates a block diagram of a system 100 having a plurality of input channels with redundancy, in an embodiment. The system 100 may be, e.g., a transmission control unit of an automobile with multiple input channels having thermal sensors in each input channel. The system 100 may also have multiple output channels (not illustrated in FIG. 1, but shown in FIG. 2), with a driver circuit (e.g., a high-side driver and a low-side driver) in each output channel for driving a respective external load (e.g., a solenoid load). In some embodiments, the sensors (e.g., a primary sensor and a redundant sensor) in each input channel are placed (e.g., formed) in close proximity to the driver circuit of a respective output channel, in order to measure the temperature of the driver circuit in that output channel. The temperature measurement is used by an interpolator to produce an estimated error in the electrical current of the driver circuit at the measured temperature. The estimated error indicates deviation of the value of the electrical current (also referred to as current for simplicity) of the driver circuit from a target current value. The system 100 may then compensate for the estimate error in the current value, such that the driver circuit of the output channel has the target current value. More details are discussed hereinafter.

As illustrated in FIG. 1, the system 100 includes a plurality of input channels (may also be referred to as channels, or sensor channels), labeled as CH0, CH1, ..., and so on. The number of channels illustrated in FIG. 1 is merely a non-limiting example, any other suitable number of channels may also be possible and are fully intended to be included within the scope of the present disclosure.

Each channel of the system 100 includes a sensor (e.g., a thermal sensor), an analog-to-digital converter (ADC), and a redundant sensor (e.g., another thermal sensor functioning as a redundancy of the sensor). For example, the channel CH0 has a sensor labeled as Sensor_0, an ADC labeled as ADC_0, and a redundant sensor labeled as Sensor_RED_0. For ease of discussion and clarity, the sensors (e.g., Sensor_0, Sensor_1, ...) are also referred to as primary sensors in the discussion herein. In addition, the primary sensors (e.g., Sensor_0, Sensor_1, ...) and the redundant sensors (e.g., Sensor_RED_0, Sensor_RED_1, ...) are collectively referred to as sensors of the system 100.

In some embodiments, each of the sensors of the system 100 is used to sense a physical phenomenon (e.g., temperature) having an analog value, and to produce an analog value (e.g., a voltage) that is indicative of (e.g., proportional to) the analog value of the physical phenomenon being measured. In an embodiment, the sensors in the input channels of the system 100 are thermal sensors for sensing temperatures. The ADC in each input channel converts the output of the primary sensor into digital values. The ADC outputs from all of the ADCs in all of the input channels are sent to a main logic block 120 for further processing. Details of the processing performed by the main logic block 120 are discussed hereinafter.

The outputs of the redundant sensors in all of the input channels are sent to a block 110, which includes a multiplexer (MUX) and an ADC labeled as ADC_RED (may also be referred to as a redundant ADC). The outputs of the redundant sensors are sent to input terminals of the MUX, and the redundant ADC is coupled to the output terminal of the MUX. The MUX in the block 110 is controlled to select one of its input signals and outputs the selected input signal at the output terminal of the MUX. The redundant ADC then converts the selected input signal of the MUX into digital values, which are sent to the main logic block 120 for further processing. In some embodiments, during normal operation of the system 100, if the primary sensor in an input channel is determined to be defective, the MUX in the block 110 may select the output of the corresponding redundant sensor in that input channel as the output of the MUX, and the output of the redundant ADC of the block 110 may be used to replace the ADC output of the defective primary sensor of that input channel.

Figure 2:
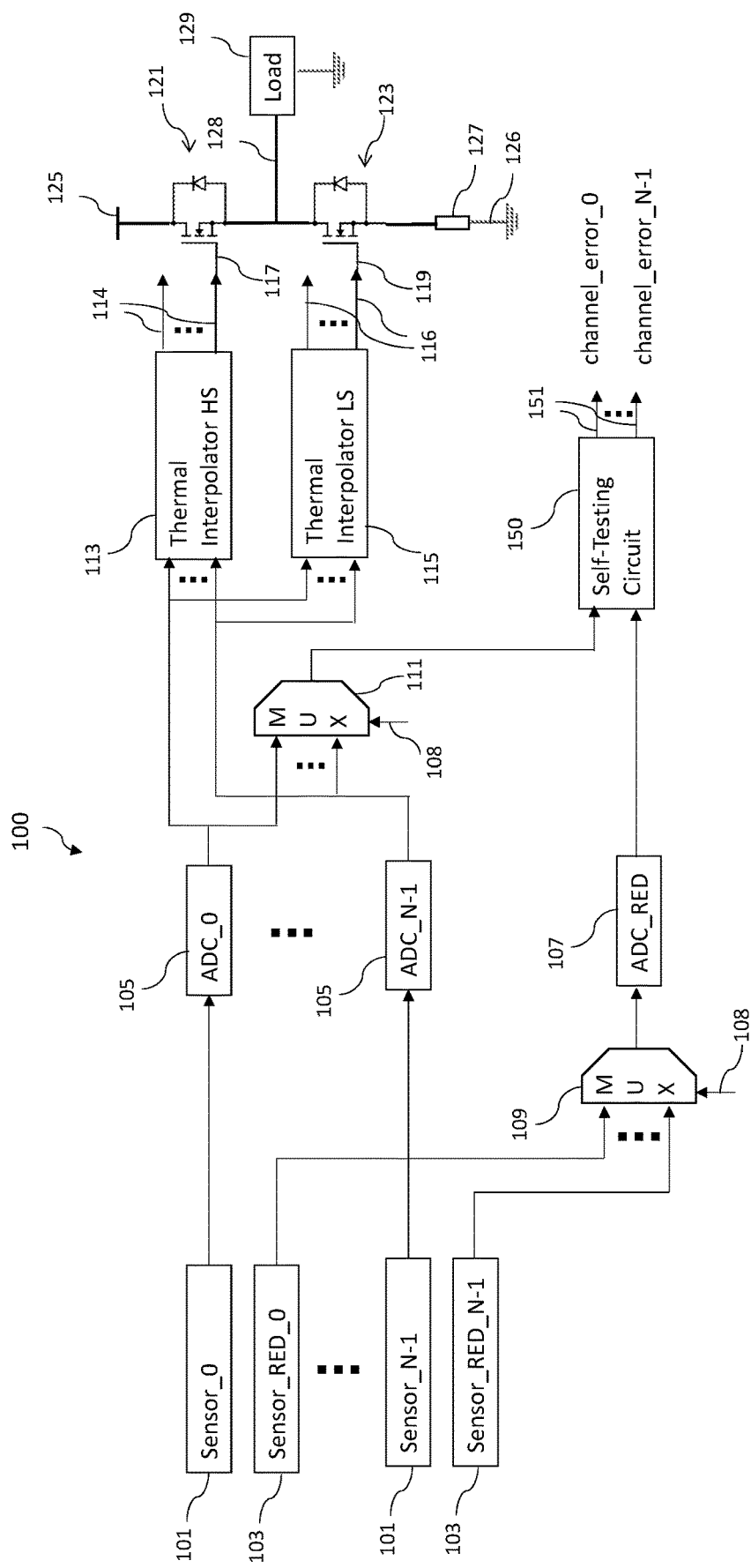
FIG. 2 illustrates a block diagram of the system of FIG. 1, but with more details, in an embodiment.

FIG. 2 illustrates a block diagram of the system 100 of FIG. 1, but with more details, in an embodiment. For simplicity, not all features of the system 100 are illustrated in FIG. 2. In FIG. 2, the primary sensor in each channel is labeled as primary sensor 101, the redundant sensor in each channel is labeled as redundant sensor 103, and the ADC in each channel is labeled as ADC 105. The block 110 in FIG. 1 corresponds to the MUX 109 in FIG. 2 and the redundant ADC 107 in FIG. 2. A selection signal 108 of the MUX 109 selects which input signal of the MUX 109 is sent as the output of the MUX 109. Note that the MUX 109 accepts analog input signals (e.g., voltages) and outputs the selected analog signal, and therefore, may also be referred to as an analog MUX. As illustrated in FIG. 2, the primary sensor 101 in each channel has a dedicated ADC 105. In contrast, all the redundant sensors 103 share the redundant ADC 107 through the use of the MUX 109.

Still referring to FIG. 2, the outputs of the ADCs 105 are sent to processing blocks 113 and 115. FIG. 2 further illustrate the driver circuit for one of the output channels, which includes a high-side switch 121 and a low-side switch 123. The high-side switch 121 and the low-side switch 123 are coupled in series between a voltage supply 125 (e.g., with a voltage of $+V_{DD}$) and a reference voltage 126 (e.g., electrical ground). A resistor 127 may be coupled between the low-side switch 123 and the reference voltage 126. To avoid cluttering, only one output channel is illustrated in FIG. 2, with the understanding that multiple output channels are formed in the system 100 for driving multiple external load.

In the example of FIG. 2, for each output channel, the processing block 113 receives the temperature measurement from the primary sensor 101 in a corresponding input channel, and calculates an estimated current error (e.g., an estimated error in the electrical current) for the driving current of the high-side switch 121 at the measured temperature. The processing block 113 may include an interpolator that performs an interpolation operation to generate the estimated current error. For example, different current errors corresponding to different temperature values may be predetermined (e.g., through simulation, calculation, or measurements) and stored in a look-up-table (LUT). If the measured temperature matches one of the temperatures in the LUT, the corresponding current error in the LUT is used as the estimated current error. If the measured temperature does not match any of the stored temperatures in the LUT, then an interpolation operation (e.g., liner interpolation) is performed to generate an estimate of current error for the measured temperature. Therefore, the processing block 113 (or 115) may also be referred to as an interpolator. In some embodiments, after the estimated current error is calculated for each output channel, the processing block 113 generates a driving current 114 (which has been corrected for the estimated current error), and feeds the driving current 114 to a control terminal 117 (e.g., a gate terminal) of the high-side switch 121 in the output channel.

The processing block 115 performs the same processing as the processing block 113 to calculate the estimated current error for the low-side driver 123 in each of the output channels, and generates a driving current 116 for the lower-side driver 123 in each of the output channels.

As illustrated in FIG. 2, a load 129 (e.g., a solenoid load) is coupled to an output terminal 128 of each output channel of the system 100, which output terminal 128 is coupled to a node between the high-side switch 121 and the low-side switch 123. Note that the load 129 is shown to illustrates the operation of the system 100, and may not be considered as part of the system 100.

FIG. 2 further illustrates a MUX 11 and a self-testing circuit 150. The outputs of the ADCs 105 are sent to input terminals of the MUX 111, and the output of the MUX 11 is sent to the self-testing circuit 150. In addition, the output of the redundant ADC 107 is also sent to the self-testing circuit 150. The self-testing circuit 150 is configured to perform self-testing of the sensors 101/103 and the MUX 109/MUX 11, details are discussed hereinafter. Note that the MUX 11 is controlled by the same selection signal 108 as the MUX 109, such that during self-testing, the MUX 11 and the MUX 109 are synchronized (e.g., select respective input signals coming from the same input channel as their respective outputs). In some embodiments, the main logic block 120 of FIG. 1 includes the MUX 11, the processing blocks 113/115, and the self-testing circuit 150. In some embodiments, the main logic block 120 may additionally include the high-side switches 121 and the low-side switches 123.

Figure 3:
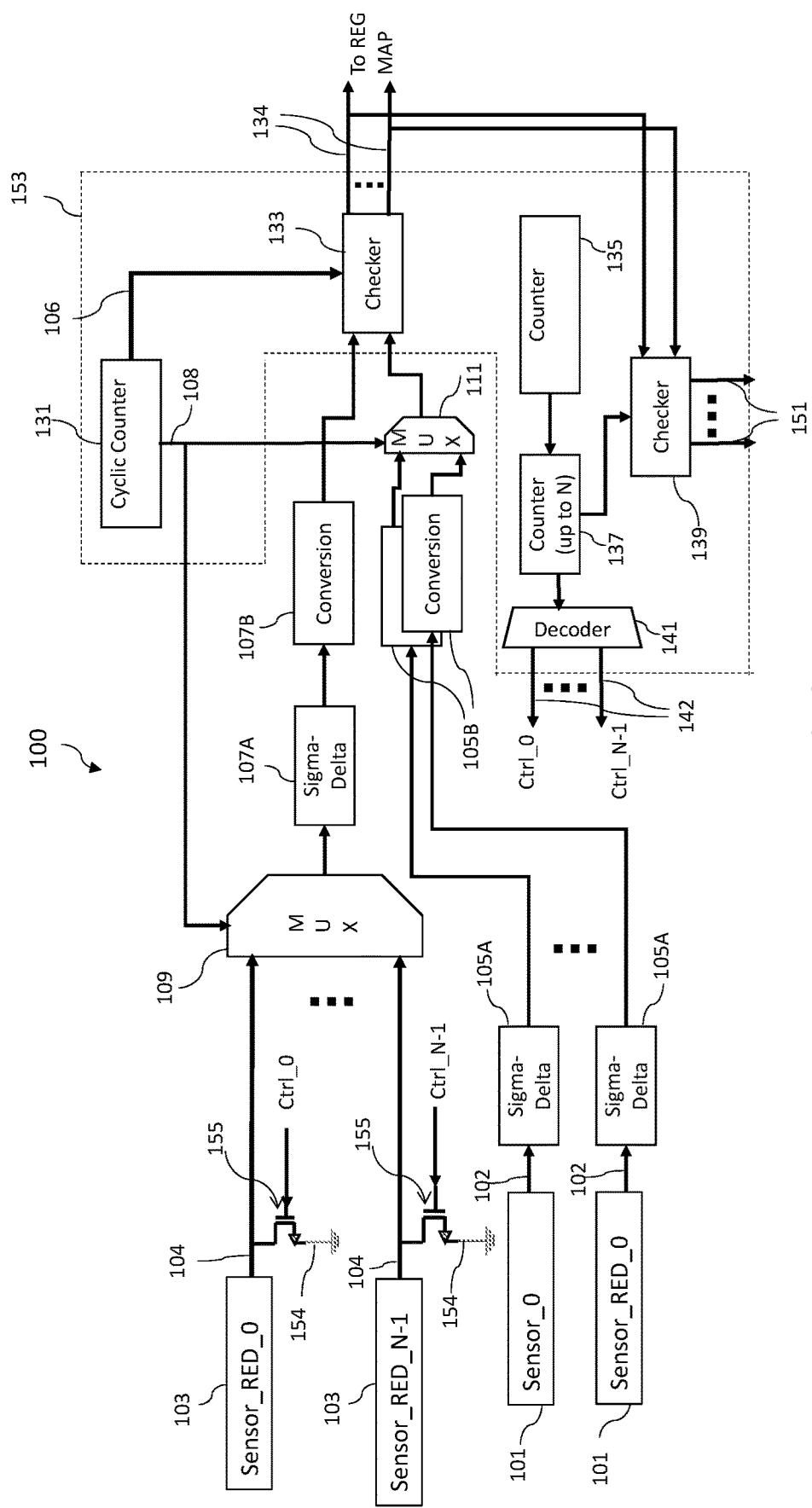
FIG. 3 illustrates a block diagram of a portion of the system of FIG. 1, with details of a self-testing circuit, in an embodiment.

FIG. 3 illustrates a block diagram of a portion of the system 100 of FIG. 1, with details of the self-testing circuit 150 of FIG. 2, in an embodiment. In some embodiments, the self-testing circuit 150 of FIG. 2 correspond to the circuit within the dashed box 153 in FIG. 3 and switches 155 in FIG. 3. In some embodiments, FIG. 3 illustrates portions of the system 100 used in a self-testing process and the electrical connections between various components of the system 100 used in the self-testing process.

In the example of FIG. 3, each of the ADCs (e.g., 105 or 107) in FIG. 2 is implemented as a sigma-delta modulator (105A or 107A) followed by a conversion circuit (105B or 107B). The sigma-delta modulator generates a one-bit data stream for its analog input signal. The conversion circuit includes low-pass filter(s) and decimator(s) (e.g. for sample rate reduction) for out-of-band noise rejection and for generating multi-bit ADC outputs from the one-bit data stream. Sigma-delta modulator and the corresponding conversion circuit are also collectively referred to as a sigma-delta ADC. Sigma-delta ADC is known in the art, details are not discussed here. Note that sigma-delta ADCs are used as a non-limiting example of the ADC used in the system 100, other types of ADCs may also be used in the system 100, as skilled artisans readily appreciate.

As illustrated in FIG. 3, the output of the redundant sensor 103 in each input channel is coupled to a first load path terminal (e.g., a drain terminal) of a respective switch 155 (e.g., an N-MOS transistor), and a second load path terminal (e.g., a source terminal) of the switch 155 is coupled to a reference voltage (e.g., electrical ground). The control terminal (e.g., a gate terminal) of the switch 155 is coupled to a respective control signal (labeled as Ctrl_0, Ctrol_1, . . . , or Ctrl_N−1) for each of the input channels.

The control signals Ctrl_0, Ctrol_1, . . . , and Ctrl_N−1 are used in a self-testing process to inject fault conditions in respective redundant sensors 103. Details are discussed hereinafter. In the illustrated embodiment, for each input channel, when the control signal closes the switch 155 (e.g., by turning on the transistor that functions as the switch) for that channel, the output terminal of the redundant sensors 103 is coupled to (e.g., directly coupled to) the reference voltage (e.g., electrical ground). This forces the output of the redundant sensor 103 (or equivalently, the corresponding input to the MUX 109) to have a zero voltage, thereby introducing or injecting a fault condition to the redundant sensor 103 in that channel. Conversely, when the control signal opens the switch 155 (e.g., by turning off the transistor), the output terminal of the redundant sensors 103 is de-coupled (e.g., disconnected) from the reference voltage (e.g., electrical ground), and the redundant sensor 103 functions normally.

As illustrated in FIG. 3, the ADC outputs for the primary sensors 101 are sent to the MUX 111, and outputs of the redundant sensor 103 are sent to the MUX 109. The output of the MUX 109 is then converted into digital samples by the sigma-delta ADC (e.g., the sigma-delta modulator 107A and the conversion circuit 107B). Both the MUX 111 and the MUX 109 are controlled by the selection signal 108, such that the outputs of the MUX 111 and MUX 109 are synchronized. In other words, the MUX 111 and the MUX 109 select input signals from the same input channel (but from different sensors in the same input channel) as their respective outputs.

Cyclic counter 131 in FIG. 3 is used to generate the selection signal 108. In some embodiments, the output of the cyclic counter 131 is incremented by one after a conversion period T of the ADC (e.g., the sigma-delta ADC) elapses, where the conversion period T is the time needed for the ADC to convert an analog input signal into a digital data. In some embodiments, the output of the cyclic counter 131 changes repeatedly from 0 to N−1, and is used as the selection signal 108. For example, the output of the cyclic counter 131 may start from zero and count up to N−1. Then, after the next conversion period T elapses, the output of the cyclic counter 131 goes back to zero, and the cyclic counter 131 counts from zero to N−1 again. In some embodiments, the cyclic counter 131 counts M numbers of clock cycles of a system clock signal, where the duration of M clock cycles of the system clock signal is equal to or larger than the conversion period T. After M numbers of clock cycles of the system clock signal elapses, the output of the cyclic counter 131 is incremented by one, or wraps back to zero if the previous output of the cyclic counter 131 is N−1. Therefore, it takes a duration of N×T seconds, or N×M system clock cycles, to compare the ADC outputs of the primary sensors 101 and the redundant sensors 103 of all of the N input channels, in some embodiments.

The output of the MUX 111 (which is the ADC output of the primary sensor 101 in the selected channel) is sent to a first input terminal of a first checker 133 (also referred to as a first checker circuit, or a first comparison circuit), and the output of the conversion circuit 107B (which is the ADC output of the redundant sensor 103 in the selected channel) is sent to a second input terminal of the first checker 133. The first checker 133 compares the digital data at the first input terminal and at the second input terminal. If there is a mismatch, an error flag is set for the corresponding selected channel.

In the example of FIG. 3, the first checker 133 generates a total of N output signals 134, each for one of the input channels. For example, the output signal 134 for an input channel may have a value of 1 if an error flag is set for that input channel, otherwise, the output signal 134 for that input channel may have a value of 0. The mismatch between the two digital data at the first and second input terminals of the first checker 133 may be defined as the two digital data being different, or may be defined as the difference between the two digital data is larger than a pre-determined threshold (e.g., differs more than one least-significant bit (LSB)), as examples. The output signals 134 of the first checker 133 are sent to a second checker 139 for further processing, details are discussed hereinafter. The output signals 134 may also be stored, e.g., in a memory region such as a register map of the self-testing circuit for further processing.

In the illustrated embodiment of FIG. 3, the cyclic counter 131 generates a control signal 106, which is sent to the first checker 133 to control (e.g., enable) the operation of the first checker 133. In an embodiment, the control signal 106 is equivalent to the selection signal 108 delayed by a conversion period T. The delay between the control signal 106 and the selection signal 108 ensures that the first checker 133 compares the ADC outputs only after the ADC conversion is completed.

Still referring to FIG. 3, the self-testing circuit further includes a first counter 135, a second counter 137, and a decoder circuit 141. In some embodiments, the first counter 135 generates a pulse (e.g., having rising edge and a falling edge) at its output when a duration of N×T elapses, e.g., after counting N×M system clock cycles. The second counter 137 counts the number of pulses generated by the first counter 135. The output of the second counter 137 is sent to the decoder circuit 141. The decoder circuits 141 generates the control signals 142 (e.g., Ctrl_0, Crtol_1, . . . , and Ctrl_N−1) at its output terminals in accordance with the output of the second counter 137. In an embodiment, when the decoder circuit 141 receives a value of i (i=0, 1, 2 . . . , or N−1) from the second counter 137, the decoder circuit 141 sets the control signal for the (i+1)-th input channel (labeled as Ctrl_i) to one, and set all of the other control signals 142 to zero. In some embodiments, the cyclic counter 131, the first counter 135, and the second counter 137 are configured to be set to an initial value (e.g., zero) after power-on, after a reset, or at the beginning of a self-testing process. In some embodiments, the cyclic counter 131, the first counter 135, and the second counter 137 are driven by the same system clock, such that the cyclic counter 131 and the first counter 135 start counting at the same time (e.g., at the same system clock edge after the self-testing process starts).

In some embodiments, the system 100 illustrated FIGS. 2 and 3 (excluding the load 129) is implemented as an integrated circuit (IC) device 100 formed on a semiconductor substrate (e.g., a silicon substrate). In some embodiments, the sensors (101 and 103) are not included in the IC device 100 to allow flexibility in the choice of external sensors used. In some embodiments, the sensors (101 and 103) and the power switches (121 and 123) are not included in the IC device 100 to provide additional flexibility in the choice of the power switches.

Details regarding the self-testing process are now discussed. In some embodiments, the purpose of the self-testing process is to check the primary sensors 101 and the redundant sensors 103 in all of the input channels, as well as checking the MUX 109 and the MUX 11, to detect component failure in the input channels. In the illustrated embodiments, the sensors are thermal sensors, and the self-testing is conducted at known temperatures, such as room temperature, a high temperature (higher than room temperature, such as 150° C.), and a lower temperature (lower than room temperature, such as −40° C.). The ADC output of the primary sensor and the ADC output of the redundancy sensor in the same input channel are compared. A mismatch of the ADC outputs indicates defective component(s) in the channel tested. The self-testing process may be performed as a quality control process during manufacturing of the device at the factory using automatic test equipment (ATE) to identify defective devices, or may be performed in the field (e.g., after the device has been deployed) periodically or on-demand to test functionality of the device. Error detection or error reduction action may be performed based on the result of the self-testing process. For example, a redundant sensor may be used to replace a faulty primary sensor after identifying a faulty primary sensor. As another example, if an input channel is determined to be defective, depending on the application and safety requirements, the system 100 may perform the self-testing again at a later time to determine if the error in the input channel is temporary, may stop driving the load at the corresponding output channel, or may instruct the system 100 to enter a safe mode once defect is detected in the input channels.

In an embodiment, at the beginning of the self-testing process, the cyclic counter 131, the first counter 135, and the second counter 137 are reset to an initial value of, e.g., zero. The first counter 135 is configured to count for a total duration of N×N×T and generates a pulse after each duration of N×T elapses, such that the output of the second counter 137 increases from, e.g., 0 to N−1 (and then wraps back to 0). Note that the output of the second counter 137 (or equivalently, the control signals 142) stays unchanged for each duration of N×T, this allows the cyclic counter 131 to sequentially select each of the N input channels for comparison by the first checker 133 while the control signals 142 remain unchanged. For example, at the beginning the self-testing process, the counter 137 has an output value of zero, and the decoder circuits 141 sets the control signal 142 for the first input channel (labeled Ctrl_0) to one, and sets all other control signals 142 to zero. As a result, the switch 155 (e.g., an N-MOS transistor) connected to the first redundant sensor 103 (labeled as Sensor_RED_0) in the first input channel is turned on, forcing the output of the first redundant sensor 103 to be zero (e.g. having a zero voltage), while the other redundant sensors 103 function normally (e.g., without fault condition injected and having non-zero output voltages corresponding to the temperature being measured). The cyclic counter 131 sequentially selects the ADC outputs from the primary sensor 101 and the redundant sensor 103 of one of the input channels for comparison by the first checker 133. Assuming that there is no defect in the primary sensors 101 and the redundant sensors 103, the injected fault condition at the redundant sensor 103 of the first input channel causes a mismatch at the first checker 133, and accordingly, the first checker 133 sets an error flag (e.g., set a value of 1) for the output signal 134 corresponding to the first input channel. Since no fault condition is injected into other input channels, the ADC outputs from the primary sensor 101 and the redundant sensor 103 of the other input channels should match, and the first checker 133 sets a value of, e.g., 0 for the output signals corresponding to the other input channels.

After the first duration of N×T, the values of the output signals 134 can be represented by a row vector V1 of length N, and can be represented by [1 0 0 . . . 0], where the first element in the vector corresponds to the error flag for the first input channel, the second element in the vector corresponds to the error flag for the second input channel, and so on. Therefore, the first element of the vector V1 has a value of 1, and all other elements in the vector V1 have value 0. During the next duration of N×T, the decoder circuit 141 sets the control signal 142 for the second input channel to one and sets all other control signals 142 to zero, thus injecting a fault condition in the second input channel (e.g., forcing the output of the redundancy sensor Sensor_RED_1 to zero), while no fault condition is injected into other input channels. The cyclic counter 131 sequentially selects ADC outputs from each of the input channels for comparison by the first checker 133, and the first checker 133 produces an output vector V2 of length N that can be represented by [0 1 0 . . . 0]. The process repeats a total of N times, such that during each duration of N×T, only one of the control signals 142 is set to one and other control signals 142 are set to zero. The output row vectors V1, V2, . . . , VN can be stacked together to form a matrix M1 of size N×N. Note that when there is no defect in the primary sensors 101, the redundant sensors 103, or the MUX 109/MUX 11, the matrix M1 is an identity matrix, where the diagonal elements of the matrix have values of 1, and all other elements have values of 0.

In some embodiments, the second checker 139 compares the outputs from the first checker 133 (e.g., the output signals 134 collected after the duration of N×N×T, or equivalently, the output vectors V1, V2, . . . , VN) with an expected output. In some embodiments, the expected output is the identify matrix, the second checker 139 stacks the output vector V1, V2, . . . , and VN generated by the first checker 133 into the matrix M1, and compares the matrix M1 with the identity matrix. If there is no mismatch between the two matrixes, the second checker 139 declares that the self-testing passes, and all the sensors (e.g., 101/103) and the multiplexers (e.g., 109/111) are functioning properly. If a particular column of the matrix M1 deviates from the expected value (e.g., the corresponding column of the identify matrix), then there is a defect in that input channel, and the self-testing fails. In other words, to pass the self-test, the output signal 134 corresponding to a particular input channel should have the error flag set (e.g., having a value of 1) only when a fault condition is injected into that input channel, and should not have the error flag set when no fault condition is injected into that input channel, in some embodiments. In the illustrated embodiment, the output signals 151 generated by the second checker 139 has N different signals, each indicating whether or not a respective input channel has defective components.

The matrix M1 formed by the output signals 134 may be used to provide more insight into the cause of the self-test failure. For example, if one of the redundant sensors in a particular channel is not working correctly or its connecting net is open/shorted, the self-test would fail even when no fault condition is injected. A possible symptom for such a defective redundant sensor is that the error flag for the output signal 134 corresponding to this particular channel is set regardless of the status of the switch 155 for that particular channel.

Figure 4:
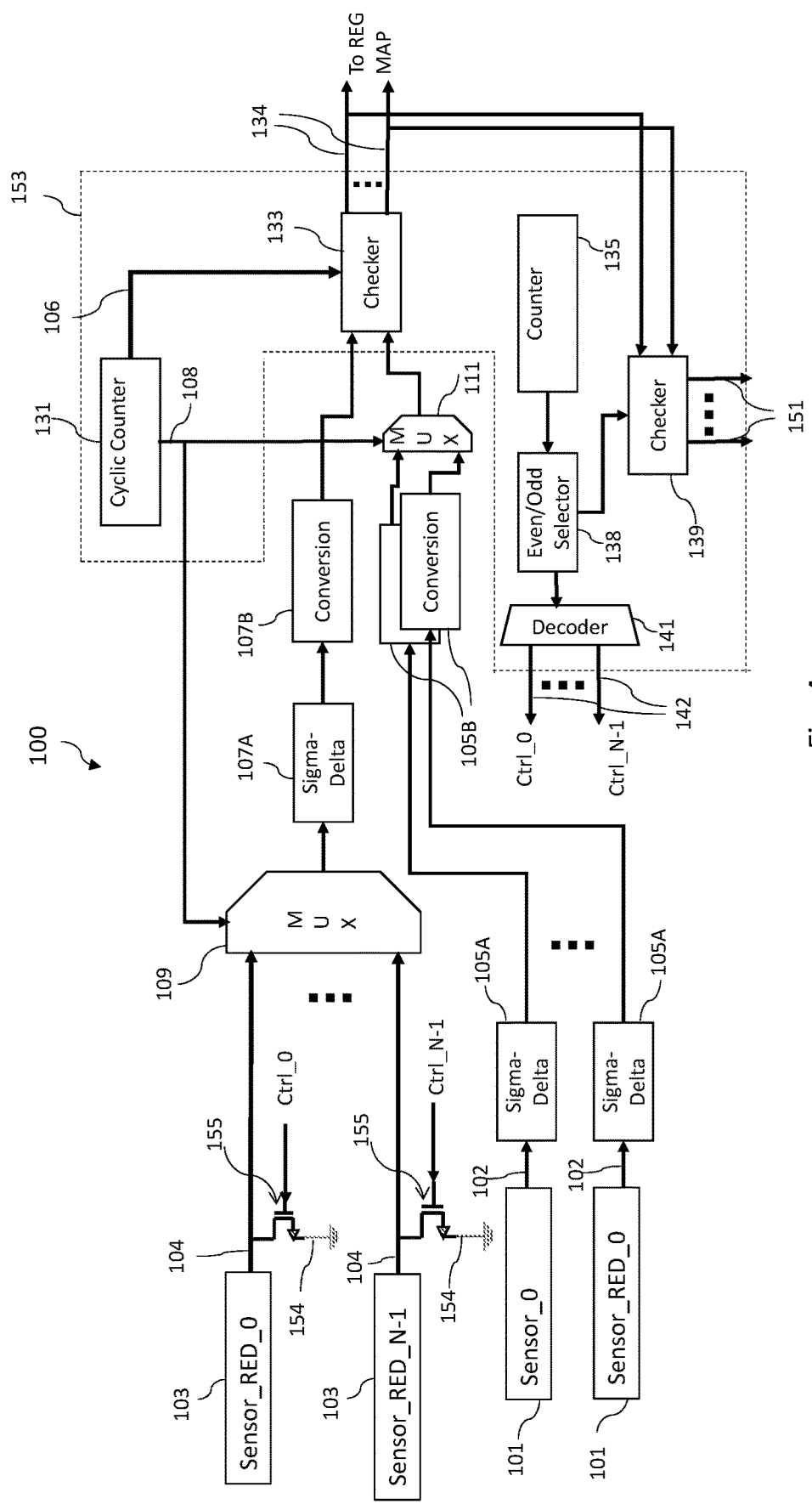
FIG. 4 illustrates a block diagram of a portion of the system of FIG. 1, with details of a self-testing circuit, in another embodiment.

The self-test process describe above with reference to FIG. 3 provides good cover coverage to detect defects in the circuits. The total time needed to perform the self-test is N×N×T. For a system 100 having 10 input channels, the self-testing process may take about 25 ms, as an example. FIG. 4 provides another self-testing circuit that has a much shorter self-test time.

FIG. 4 illustrates a block diagram of a portion of the system of FIG. 1, with details of a self-testing circuit, in another embodiment. The circuits in FIG. 4 is similar to that in FIG. 3, but with the second counter 137 replaced by an even/odd selector 138. In some embodiments, the output of the even/odd selector 138 toggles (e.g., alternates) between an even number (e.g., 0) and an odd number (e.g., 1) each time the first counter 135 generates an output pulse (e.g., after each duration of N×T). For example, the output of the even/odd selector 138 is an even number for a duration of N×T, then is an odd number for a subsequent duration of N×T, and so on. The even/odd selector 138 may be implemented as a one-bit counter, where the one-bit counter counts repeated between zero and one. For example, the one-bit counter counts from 0 to 1, then wraps back to 0 and count up to 1 again.

In some embodiments, the decoder circuit 141 of FIG. 4 sets the odd-indexed control signals 142 (e.g., Ctrl_1, Ctrl_3, . . . , and so on) to 1 and the even-indexed control signals 142 (e.g., Ctrl_0, Ctrl_2, . . . , and so on) to zero, when the output of the even/odd selector 138 is an odder number. In addition, the decoder circuit 141 of FIG. 4 sets the odd-indexed control signals 142 to 0 and the even-indexed control signals 142 to 1, when the output of the even/odd selector 138 is an even number. For example, after the self-testing process starts, in the first duration of N×T, the output of the even/odd selector 138 is zero (an even number). Therefore, the outputs of the redundant sensors 103 in even-indexed input channels are forced to zero to introduce fault conditions, and the output signals 134 corresponding to the even-indexed input channels should have the error flags set, assuming there is no defective components in the system 100. In the second duration of N×T, the output of the even/odd selector 138 is one (an odd number), the output of the redundant sensors 103 in the odd-indexed input channels are forced to zero to introduce fault conditions, and the output signals 134 corresponding to the odd-indexed input channels should have the error flags set, assuming there is no defective components in the system 100. In other words, the self-test passes if the error flags of the output signals 134 corresponding to the odd-indexed channels are set when the output of the even/odd selector 138 is an odder number, and if the error flags of the output signals 134 corresponding to the even-indexed channels are set when the output of the even/odd selector 138 is an even number. Skilled artisans will readily appreciate that in an alternative embodiment, the decoder 143 may set the odd-indexed control signals 142 and the even-indexed control signals 142 in an opposite way to what is described above, and the pass-fail criteria for the self-test should be adjusted accordingly. Such a modification is straightforward for skilled artisans, thus details are not described here.

In another embodiment, the decoder circuit 141 of FIG. 4 set all of the control signals 142 to one when the output of the even/odd selector 138 has a first value (e.g., an even value), and sets all of the control signals 142 to zero when the output of the even/odd selector 138 has a second value (e.g., an odd value). Therefore, fault conditions are injected into all input channels when the even/odd selector 138 has the first value, and no fault condition is injected into any of the input channels when the even/odd selector 138 has the second value. Accordingly, the self-test passes if the error flags of the output signal 134 for all input channels are set when the output of the even/odd selector 138 has the first value, and if the error flags of the output signal 134 all of the input channels are not set when the output of the even/odd selector 138 has the second value.

The total self-testing time for the system 100 in FIG. 4 is 2×N×T. For the above example of a system 100 having 10 input channels, the self-testing process of FIG. 4 may be reduced to about 5 ms, as an example. The self-testing process of FIG. 4 reduces the self-test time, but at the expense of reduced capability to detect defective components.

Figure 5:
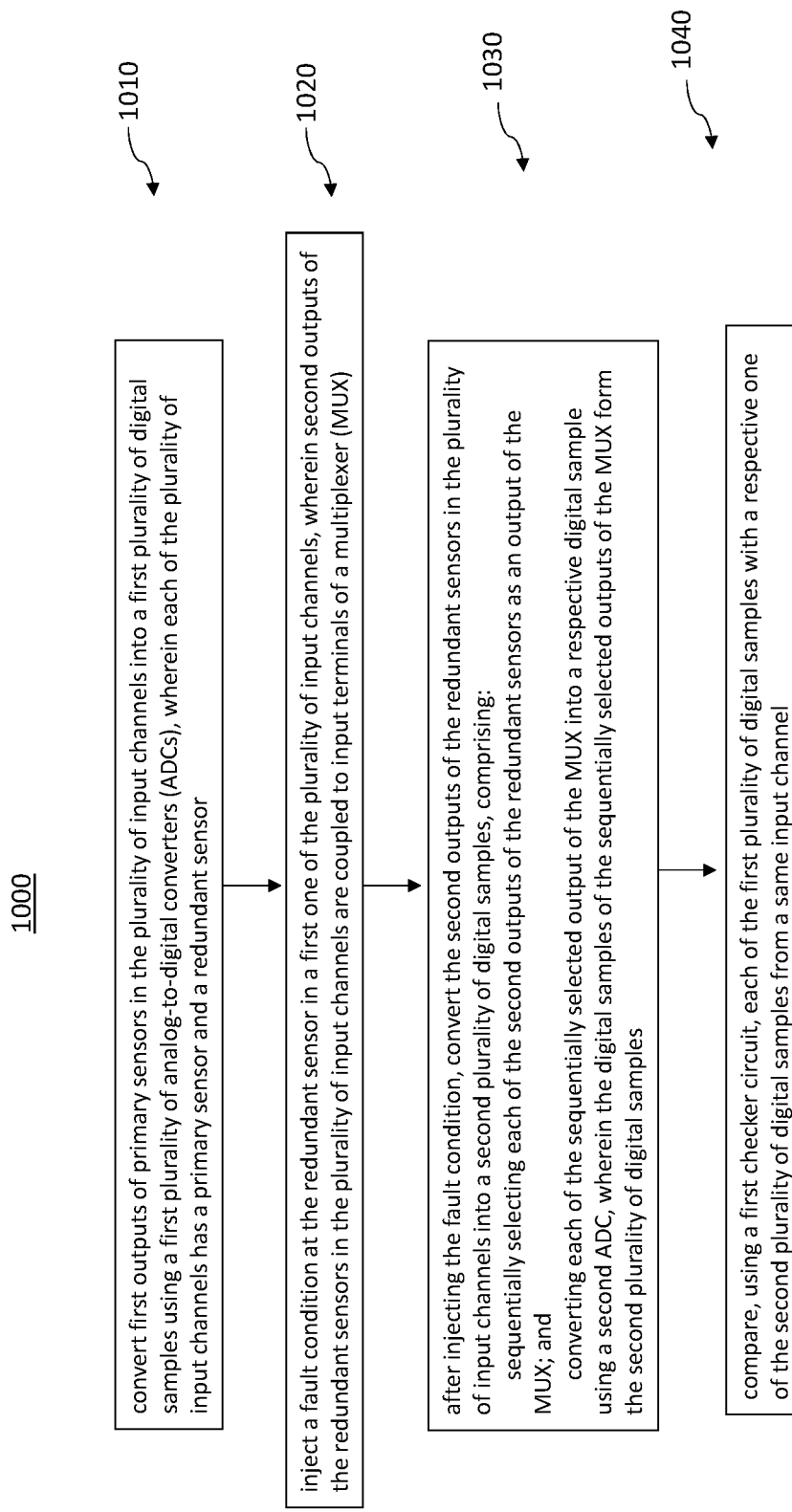
FIG. 5 illustrates a flow chart of a method of testing a device having a plurality of input channels, in an embodiment.

FIG. 5 illustrates a flow chart of a method of testing a device having a plurality of input channels, in an embodiment. It should be understood that the embodiment method shown in FIG. 5 is merely an example of many possible embodiment methods. One of ordinary skill in the art would recognize many variations, alternatives, and modifications. For example, various steps as illustrated in FIG. 5 may be added, removed, replaced, rearranged, or repeated.

Referring to FIG. 5, at block 1010, first outputs of primary sensors in the plurality of input channels are converted into a first plurality of digital samples using a first plurality of analog-to-digital converters (ADCs), wherein each of the plurality of input channels has a primary sensor and a redundant sensor. At block 1020, a fault condition is injected at the redundant sensor in a first one of the plurality of input channels, wherein second outputs of the redundant sensors in the plurality of input channels are coupled to input terminals of a multiplexer (MUX). At block 1030, after injecting the fault condition, the second outputs of the redundant sensors in the plurality of input channels are converted into a second plurality of digital samples, comprising: sequentially selecting each of the second outputs of the redundant sensors as an output of the MUX; and converting each of the sequentially selected output of the MUX into a respective digital sample using a second ADC, wherein the digital samples of the sequentially selected outputs of the MUX form the second plurality of digital samples. At block 1040, each of the first plurality of digital samples is compared with a respective one of the second plurality of digital samples from a same input channel using a first checker circuit.

Embodiments may achieve advantages. For example, the disclosed self-testing circuits and methods covers both the sensors (e.g., primary sensors and redundant sensors) and the multiplexers (e.g., the analog MUX 109 and the digital MUX 111), which may not be achievable for existing self-testing methods. In addition, by analyzing the output of the first checker 133 and comparing the output of the first checker 133 with an expected output, the second checker 139 not only detects defective components in different input channels, but also is able to provide more granularity into the failure mechanism. Note that the disclosed self-testing process can be performed without the need of an external control signal. Therefore, the self-testing process may be performed in the background, e.g., in parallel during a calibration process of the system 100. Therefore, in embodiments where the calibration time is longer than the self-testing time, the time used for the self-testing process is invisible by the system, because the self-testing process is run in the background in parallel to the calibration process, and is finished before the calibration process. This greatly reduces the ATE test time during test phase of the IC device and reduces manufacturing cost.

Example embodiments of the present invention are summarized here. Other embodiments can also be understood from the entirety of the specification and the claims filed herein.

Example 1. In an embodiment, a circuit includes: a first plurality of analog-to-digital converters (ADCs) configured to be coupled to respective ones of a first plurality of sensors; a first multiplexer (MUX), wherein input terminals of the first MUX are coupled to respective output terminals of the first plurality of ADCs; a second MUX, wherein input terminals of the second MUX are configured to be coupled to respective ones of a second plurality of sensors, wherein each of the second plurality of sensors is a redundant sensor for a respective one of the first plurality of sensors; a second ADC coupled to an output terminal of the second MUX, wherein the first MUX and the second MUX are controlled by a selection signal; a first checker circuit, wherein a first input terminal of the first checker circuit is coupled to an output terminal of the first MUX, and a second input terminal of the first checker circuit is coupled to an output terminal of the second ADC, wherein the first checker circuit is configured to compare a first data at the first input terminal of the first checker circuit with a second data at the second input terminal of the first checker circuit; and a third plurality of switches coupled between respective ones of the input terminals of the second MUX and a reference voltage node.

Example 2. The circuit of Example 1, wherein the first MUX and the second MUX are controlled by the selection signal such that during a self-testing process of the circuit, a first ADC output of a first sensor of the first plurality of sensors is outputted at the output terminal of the first MUX, and a second ADC output of a second sensor of the second plurality of sensors is outputted at the output terminal of the second ADC, wherein the second sensor is a redundant sensor of the first sensor.

Example 3. The circuit of Example 2, wherein each switch of the third plurality of switches is controlled by a respective control signal having a first value or a second value, wherein the control signal having the first value is configured to close the switch and connect a respective input terminal of the second MUX to the reference voltage node, wherein the control signal having the second value is configured to open the switch and disconnect the respective input terminal of the second MUX from the reference voltage node.

Example 4. The circuit of Example 3, wherein the reference voltage node is configured to be connected to electrical ground.

Example 5. The circuit of Example 3, further comprising a cyclic counter, wherein the cyclic counter is configured to count repeatedly from 0 to N−1, wherein N is the number of sensors in the first plurality of sensors, wherein during the self-testing process of the circuit, an output of the cyclic counter is incremented by one after a pre-determined period of time T elapses, wherein the output of the cyclic counter is the selection signal.

Example 6. The circuit of Example 5, further comprising: a first counter configured to generate a pulse after a pre-determined period of time N×T elapses; a second counter configured to count the number of pulses generated by the first counter; and a decoder coupled to the second counter, wherein the decoder is configured to generate a plurality of control signals in accordance with an output of the second counter, wherein each of the plurality of control signals has the first value or the second value, wherein each of the plurality of control signals is configured to control a respective switch of the third plurality of switches.

Example 7. The circuit of Example 6, wherein the second counter counts from 0 to N−1.

Example 8. The circuit of Example 7, wherein the decoder is configured to, when the output of the second counter has a value of m, wherein m=0, 1, . . . , or N−1: assign the first value for the (m+1)-th control signal of the plurality of control signals; and assign the second value for other control signals of the plurality of control signals.

Example 9. The circuit of Example 6, wherein the second counter counts repeatedly from 0 to 1.

Example 10. The circuit of Example 9, wherein the decoder is configured to: assign the first value and the second value for odd-indexed control signals of the plurality of control signals and even-indexed control signals of the plurality of signals, respectively, when the output signal of the second counter is zero; and assign the second value and the first value for the odd-indexed control signals of the plurality of control signals and the even-indexed control signals of the plurality of signals, respectively, when the output signal of the second counter is one.

Example 11. The circuit of Example 9, wherein the decoder is configured to: assign the first value for the plurality of control signals when the output signal of the second counter is zero; and assign the second value for the plurality of control signals when the output signal of the second counter is one.

Example 12. The circuit of Example 6, further comprising a second checker circuit coupled to the first checker circuit, wherein the second checker circuit is configured to compare outputs of the first checker circuit with expected outputs of the first checker circuit.

Example 13. In an embodiment, an integrated circuit (IC) device having a plurality of input channels includes: a first multiplexer (MUX) configured to receive first outputs from a first plurality of analog-to-digital converters (ADCs) coupled to a plurality of primary sensors; a second MUX configured to receive second outputs from a plurality of redundant sensors, wherein each redundant sensor of the plurality of redundant sensors and a respective primary sensor of the plurality of primary sensors are disposed in a same input channel of the plurality of input channels and are configured to sense a same physical phenomenon; a second ADC coupled to an output terminal of the second MUX; a first checker circuit configured to compare a first output of the first MUX and a second output of the second ADC, wherein during a self-testing process of the IC device, the first MUX and the second MUX are configured to be synchronized such that the first output of the first MUX and the second output of the second ADC are digital samples from the same input channel; and a plurality of switches, wherein each switch of the plurality of switches is coupled between a respective input terminal of the second MUX and a reference voltage node.

Example 14. The IC device of Example 13, further comprising the first plurality of ADCs.

Example 15. The IC device of Example 13, wherein the reference voltage node is configured to be coupled to electrical ground, wherein each switch of the plurality of switches is configured to, when closed, force a voltage at the respective input terminal of the second MUX to electrical ground.

Example 16. The IC device of Example 15, further comprising: a circuit configured to generate a plurality of control signals for controlling respective ones of the plurality of switches, where the plurality of control signal have a first set of values during a first period of time, and have a second set of values different from the first set of values during a second period of time; and a second checker circuit, wherein the second checker circuit is configured to receive outputs of the first checker circuit during the first period of time and the second period of time, and is configured to compare the outputs of the first checker circuit with expected outputs of the first checker circuit.

Example 17. In an embodiment, a method of testing a device having a plurality of input channels includes: converting first outputs of primary sensors in the plurality of input channels into a first plurality of digital samples using a first plurality of analog-to-digital converters (ADCs), wherein each of the plurality of input channels has a primary sensor and a redundant sensor; injecting a fault condition at the redundant sensor in a first one of the plurality of input channels, wherein second outputs of the redundant sensors in the plurality of input channels are coupled to input terminals of a multiplexer (MUX); and after injecting the fault condition, converting the second outputs of the redundant sensors in the plurality of input channels into a second plurality of digital samples, which includes: sequentially selecting each of the second outputs of the redundant sensors as an output of the MUX; and converting each of the sequentially selected output of the MUX into a respective digital sample using a second ADC, wherein the digital samples of the sequentially selected outputs of the MUX form the second plurality of digital samples. The method further includes comparing, using a first checker circuit, each of the first plurality of digital samples with a respective one of the second plurality of digital samples from a same input channel.

Example 18. The method of Example 17, further comprising, in response to detecting mismatches between the first plurality of digital samples and the second plurality of digital samples, setting, by the first check circuit, error flags for input channels having mismatches.

Example 19. The method of Example 18, further comprising, comparing, using a second checker circuit, outputs of the first checker circuit with expected outputs of the first checker circuit.

Example 20. The method of Example 17, further comprising, after comparing each of the first plurality of digital samples with a respective one of the second plurality of digital samples: injecting another fault condition at the redundant sensor in a second one of the plurality of input channels; after injecting the another fault condition, converting the second outputs of the redundant sensors in the plurality of input channels into a third plurality of digital samples; and comparing, using the first checker circuit, each of the first plurality of digital samples with a respective one of the third plurality of digital samples from a same input channel.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
a first plurality of analog-to-digital converters (ADCs) configured to be coupled to respective ones of a first plurality of sensors;
a first multiplexer (MUX), wherein input terminals of the first MUX are coupled to respective output terminals of the first plurality of ADCs;
a second MUX, wherein input terminals of the second MUX are configured to be coupled to respective ones of a second plurality of sensors, wherein each of the second plurality of sensors is a redundant sensor for a respective one of the first plurality of sensors;
a second ADC coupled to an output terminal of the second MUX, wherein the first MUX and the second MUX are controlled by a selection signal;
a first checker circuit, wherein a first input terminal of the first checker circuit is coupled to an output terminal of the first MUX, and a second input terminal of the first checker circuit is coupled to an output terminal of the second ADC, wherein the first checker circuit is configured to compare a first data at the first input terminal of the first checker circuit with a second data at the second input terminal of the first checker circuit; and
a third plurality of switches coupled between respective ones of the input terminals of the second MUX and a reference voltage node.

2. The circuit of claim 1, wherein the first MUX and the second MUX are controlled by the selection signal such that during a self-testing process of the circuit, a first ADC output of a first sensor of the first plurality of sensors is outputted at the output terminal of the first MUX, and a second ADC output of a second sensor of the second plurality of sensors is outputted at the output terminal of the second ADC, wherein the second sensor is a redundant sensor of the first sensor.

3. The circuit of claim 2, wherein each switch of the third plurality of switches is controlled by a respective control signal having a first value or a second value, wherein the control signal having the first value is configured to close the switch and connect a respective input terminal of the second MUX to the reference voltage node, wherein the control signal having the second value is configured to open the switch and disconnect the respective input terminal of the second MUX from the reference voltage node.

4. The circuit of claim 3, wherein the reference voltage node is configured to be connected to electrical ground.

5. The circuit of claim 3, further comprising a cyclic counter, wherein the cyclic counter is configured to count repeatedly from 0 to N−1, wherein N is the number of sensors in the first plurality of sensors, wherein during the self-testing process of the circuit, an output of the cyclic counter is incremented by one after a pre-determined period of time T elapses, wherein the output of the cyclic counter is the selection signal.

6. The circuit of claim 5, further comprising:
a first counter configured to generate a pulse after a pre-determined period of time N×T elapses;
a second counter configured to count the number of pulses generated by the first counter; and
a decoder coupled to the second counter, wherein the decoder is configured to generate a plurality of control signals in accordance with an output of the second counter, wherein each of the plurality of control signals has the first value or the second value, wherein each of the plurality of control signals is configured to control a respective switch of the third plurality of switches.

7. The circuit of claim 6, wherein the second counter counts from 0 to N−1.

8. The circuit of claim 7, wherein the decoder is configured to, when the output of the second counter has a value of m, wherein m=0, 1, . . . , or N−1:
assign the first value for the (m+1)-th control signal of the plurality of control signals; and
assign the second value for other control signals of the plurality of control signals.

9. The circuit of claim 6, wherein the second counter counts repeatedly from 0 to 1.

10. The circuit of claim 9, wherein the decoder is configured to:
assign the first value and the second value for odd-indexed control signals of the plurality of control signals and even-indexed control signals of the plurality of signals, respectively, when the output signal of the second counter is zero; and
assign the second value and the first value for the odd-indexed control signals of the plurality of control signals and the even-indexed control signals of the plurality of signals, respectively, when the output signal of the second counter is one.

11. The circuit of claim 9, wherein the decoder is configured to:
assign the first value for the plurality of control signals when the output signal of the second counter is zero; and
assign the second value for the plurality of control signals when the output signal of the second counter is one.

12. The circuit of claim 6, further comprising a second checker circuit coupled to the first checker circuit, wherein the second checker circuit is configured to compare outputs of the first checker circuit with expected outputs of the first checker circuit.

13. An integrated circuit (IC) device having a plurality of input channels, the IC device comprising:
a first multiplexer (MUX) configured to receive first outputs from a first plurality of analog-to-digital converters (ADCs) coupled to a plurality of primary sensors;
a second MUX configured to receive second outputs from a plurality of redundant sensors, wherein each redundant sensor of the plurality of redundant sensors and a respective primary sensor of the plurality of primary sensors are disposed in a same input channel of the plurality of input channels and are configured to sense a same physical phenomenon;
a second ADC coupled to an output terminal of the second MUX;
a first checker circuit configured to compare a first output of the first MUX and a second output of the second ADC, wherein during a self-testing process of the IC device, the first MUX and the second MUX are configured to be synchronized such that the first output of the first MUX and the second output of the second ADC are digital samples from the same input channel; and a plurality of switches, wherein each switch of the plurality of switches is coupled between a respective input terminal of the second MUX and a reference voltage node.

14. The IC device of claim 13, further comprising the first plurality of ADCs.

15. The IC device of claim 13, wherein the reference voltage node is configured to be coupled to electrical ground, wherein each switch of the plurality of switches is configured to, when closed, force a voltage at the respective input terminal of the second MUX to electrical ground.

16. The IC device of claim 15, further comprising:
a circuit configured to generate a plurality of control signals for controlling respective ones of the plurality of switches, where the plurality of control signals have a first set of values during a first period of time, and have a second set of values different from the first set of values during a second period of time; and
a second checker circuit, wherein the second checker circuit is configured to receive outputs of the first checker circuit during the first period of time and the second period of time, and is configured to compare the outputs of the first checker circuit with expected outputs of the first checker circuit.

17. A method of testing a device having a plurality of input channels, the method comprising:
converting first outputs of primary sensors in the plurality of input channels into a first plurality of digital samples using a first plurality of analog-to-digital converters (ADCs), wherein each of the plurality of input channels has a primary sensor and a redundant sensor;
injecting a fault condition at the redundant sensor in a first one of the plurality of input channels, wherein second outputs of the redundant sensors in the plurality of input channels are coupled to input terminals of a multiplexer (MUX);
after injecting the fault condition, converting the second outputs of the redundant sensors in the plurality of input channels into a second plurality of digital samples, comprising:
sequentially selecting each of the second outputs of the redundant sensors as an output of the MUX; and
converting each of the sequentially selected output of the MUX into a respective digital sample using a second ADC, wherein the digital samples of the sequentially selected outputs of the MUX form the second plurality of digital samples; and
comparing, using a first checker circuit, each of the first plurality of digital samples with a respective one of the second plurality of digital samples from a same input channel.

18. The method of claim 17, further comprising, in response to detecting mismatches between the first plurality of digital samples and the second plurality of digital samples, setting, by the first check circuit, error flags for input channels having mismatches.

19. The method of claim 18, further comprising, comparing, using a second checker circuit, outputs of the first checker circuit with expected outputs of the first checker circuit.

20. The method of claim 17, further comprising, after comparing each of the first plurality of digital samples with a respective one of the second plurality of digital samples:
injecting another fault condition at the redundant sensor in a second one of the plurality of input channels;
after injecting the another fault condition, converting the second outputs of the redundant sensors in the plurality of input channels into a third plurality of digital samples; and
comparing, using the first checker circuit, each of the first plurality of digital samples with a respective one of the third plurality of digital samples from a same input channel.

* * * * *